United States Patent [19]

Nambu et al.

[11] Patent Number: 4,866,506

[45] Date of Patent: Sep. 12, 1989

[54] PLASTIC-SEALED IC DEVICE OF HEAT-RESISTANT CONSTRUCTION

[75] Inventors: Seigo Nambu; Hiroyuki Fukazawa; Shinji Takei, all of Tokyo, Japan

[73] Assignee: Oki Electric Industry Co., Ltd., Tokyo, Japan

[21] Appl. No.: 9,580

[22] Filed: Jan. 29, 1987

Related U.S. Application Data

[63] Continuation of Ser. No. 717,839, Mar. 29, 1985, abandoned.

[30] Foreign Application Priority Data

Apr. 2, 1984 [JP] Japan ................................ 59-63178

[51] Int. Cl.4 ............................................ H01L 23/28
[52] U.S. Cl. ....................................... 357/72; 357/68; 357/70
[58] Field of Search .............................. 357/68, 70, 72

[56] References Cited

U.S. PATENT DOCUMENTS 3,902,148 8/1975 Drees et al. ............................ 357/70
4,025,716 5/1977 Morse ...................................... 357/70
4,329,701 5/1982 Brenneman ............................ 357/72

Primary Examiner—Edward J. Wojciechowicz
Attorney, Agent, or Firm—Wenderoth, Lind & Ponack

[57] ABSTRACT

A plastic-sealed IC device comprises an IC lead frame having a chip mounting area, an IC chip fixedly mounted on the IC lead frame in the chip mounting frame area, and a plastic package molded so as to seal the IC lead frame therein.

The plastic package has an opening formed so as to allow the backside of the chip mounting area to communicate with the atomonphere to discharge the moisture accumulating in the vicinity of the IC chip.

2 Claims, 8 Drawing Sheets

MOISTURE PERMEABILITY CHARACTERISTICS

PLASTIC-SEALED IC DEVICE OF HEAT-RESISTANT CONSTRUCTION

This application is a continuation, of now abandoned application Ser. No. 717,339, filed Mar. 29, 1985, now abandoned.

BACKGROUND OF THE INVENTION

1. Field of the Invention

The present invention relates to a plastic-sealed IC device packed in a plastic package resistant to thermal cracking.

2. Description of the Prior Art

A plastic-sealed IC device formed by sealing an IC chip mounted on a lead frame with a resin, such as epoxy resin, can be manufactured at a lower manufacturing cost as compared with an equivalent ceramic-sealed IC device, and is capable of being manufactured through mass production processes. Accordingly, in resent years, plastic-sealed IC devices have been applied to the production of DIPs (dual-in-line packages).

A prior art relating to a plastic-sealed IC device is disclosed, for example, in U.S. Pat. No. 3,611,061.

Recently, flat plastic-sealed IC devices having a plurality of terminal pins extending from the circumference of the package have been put to practical use, with the enhancement of the degree of integration of IC devices. A process of manufacture of such a flat plastic-sealed IC device is disclosed in U.S. Pat. No. 3,444,440. This flat plasticsealed IC device, indicated at 10 in FIG. 1, in general is mounted on a printed circuit board 12 as shown in FIG. 1.

The pins 14 of the IC device are connected fixedly by soldering to the conductors 16 of the printed circuit board 12.

Recently, the soldering process has been automated for mass production, in which a printed circuit board mounted with IC devices is dipped directly into molten solder of around 200° to 260° C. temperature or the printed circuit board is heated through infrared heating.

However, a crack 18, as illustrated in FIG. 1, often develops in the package 20 of a flat plastic-sealed IC device when the flat plastic-sealed IC device is subjected to the soldering process in which the entirety of the flat plasticsealed IC device is heated.

The estimated causes of such cracking are as follows. Generally, a resin molding contains a mold lubricant to facilitate the extraction of the same from the mold after solidification, and hence a gap is formed inevitably between the resin molding and the lead frame. Consequently, moisture permeates the IC chip mounting area 22 along the surfaces of the pins of the lead frame.

Furthermore, since resins for sealing an IC chip, in general, are water-permeable, moisture is liable to accumulate around the IC chip mounting area. As shown in FIG. 7, for instance, it is confirmed that moisture penetrates into the vicinity of the IC chip 24 even when a plastic-sealed IC device is placed merely in the atmosphere for about 100 hours.

On the other hand, the strength of the resin molding is deteriorated when the resin molding is heated to a temperature corresponding to the fusing temperature of the solder.

It is inferred that when a plastic-sealed IC device containing moisture is heated in the soldering process, the moisture accumulating in the vicinity of the IC chip mounting area 22 evaporates and expands to produce the crack 18 in the plastic package.

The crack in the plastic package in the soldering process spoils the appearance of the plastic-sealed IC device and, further, causes the breakage of conductors 26 interconnecting the IC chip and the lead frame and the corrosion of aluminium wiring formed over the surface of the IC chip due to moisture permeation.

SUMMARY OF THE INVENTION

Accordingly, it is an object of the present invention to provide a plastic-sealed IC device packed in a plastic package resistant to thermal cracking.

It is another object of the present invention to provide a flat plastic-sealed IC device capable of being soldered to a printed circuit board at a high yield rate.

A plastic-sealed IC device according to the present invention is characterized by an opening formed in the sealing resin wall on the backside of the IC chip so as to open into the atmosphere so that the vicinity of the IC chip mounting area is allowed to communicate with the atmosphere. This opening exposes the backside of the IC chip or the surface of a thin wall of the sealing resin to the atmosphere.

The above and other objects, features and advantages of the present invention will become more apparent from the following detailed description of preferred embodiments thereof taken in conjunction with the accompanying drawings.

DESCRIPTION OF THE PREFERRED EMBODIMENTS

Preferred embodiments of the present invention will be described hereinafter with reference to FIGS. 3(a) and 3(b).

Figure 1:
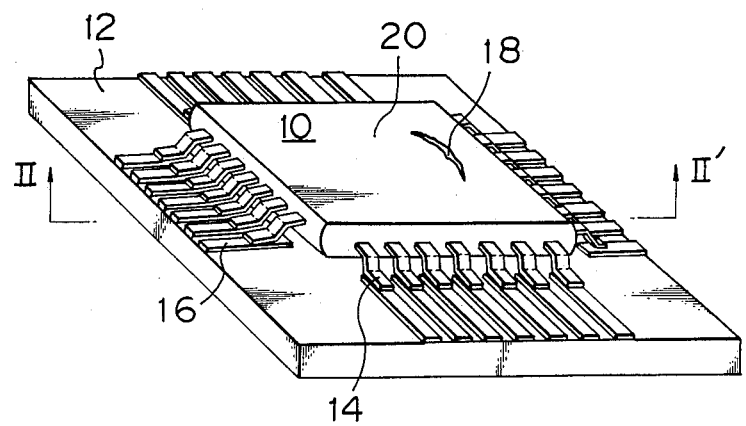
FIG. 1 is a perspective view of a conventional flat plastic-sealed IC device mounted on a printed circuit, in which a crack is formed in the plastic package.
Figure 2:
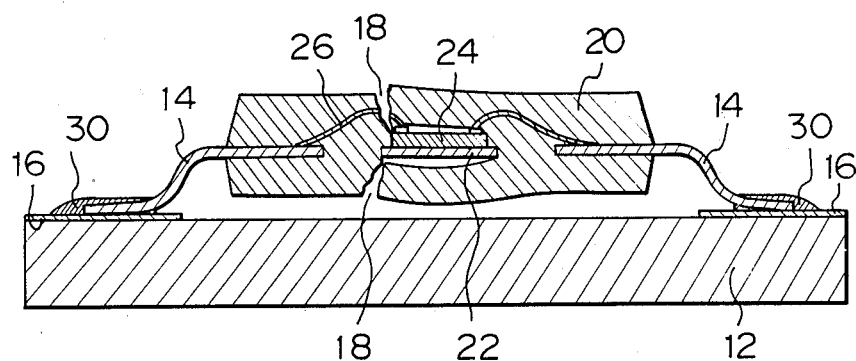
FIG. 2 is a sectional view taken on line II—II of FIG. 1.
Figure 3A:
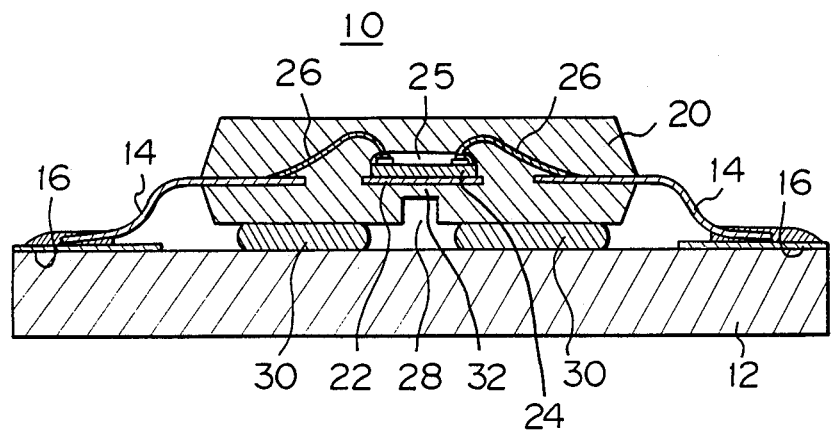
FIG. 3(a) is a sectional view of a flat plastic-sealed IC device, in a first embodiment, according to the present invention.
Figure 3B:
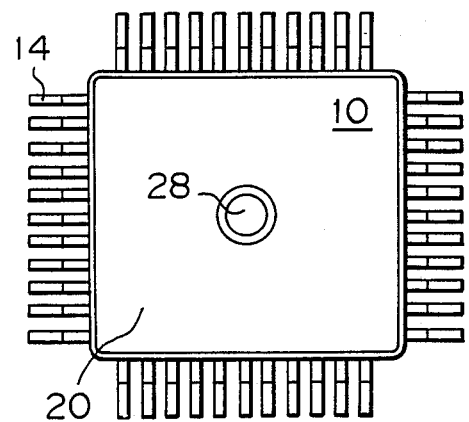
FIG. 3(b) is a plan view of the flat plastic-sealed IC device of FIG. 3(a)

Referring to FIGS. 3(a) and 3(b), a flat plastic-sealed IC device includes a lead frame having a chip mounting area 22 and pins 14. The lead frame, in general, is formed by a Fe-Ni alloy. An IC chip 24 disposed in the chip mounting area 22 and is secured thereto by die bonding. The pad area of the IC chip 24 and the pins 14 are interconnected, for example, with fine Au wires 26 bonded thereto. The IC chip 24 is covered over the surface thereof with a silicon resin, for example, a silicon resin designated by the trade name, JCR 6131 (Junction Coating Resin) to obviate the intrusion of foreign matters into the IC chip 24.

The lead frame mounted with the IC chip 24 is placed in a mold to be sealed with epoxy resin by molding. The plastic package is molded so that an opening 28 shown in FIGS. 3(a) and 3(b) is formed under the chip mounting area 22. The size of the opening 22 is, for example, 1 to 2 mm in diameter. The thickness of the epoxy resin wall between the backside of the chip mounting area 22 and the bottom of the opening 28 is, for example, 0.1 mm or less, and the depth of the opening 28 is approximately 0.75 mm.

The IC device 10 thus constructed is placed on a printed circuit board 12 and fixed thereto with a heat-resistant adhesive 34, such as epoxy resin, before being subjected to the soldering process.

Figure 4:
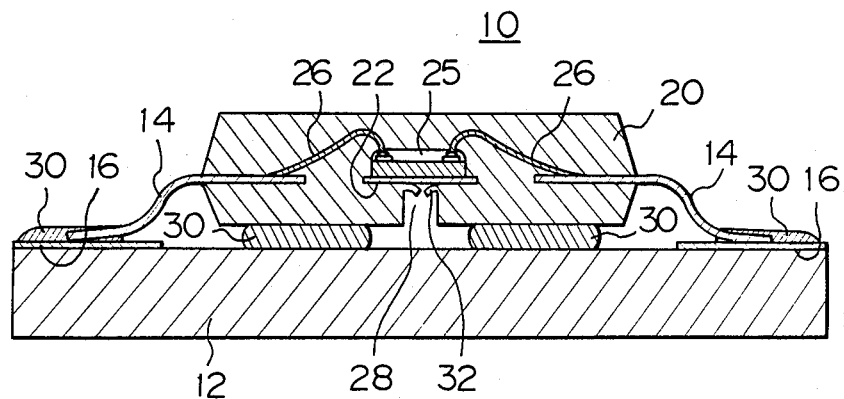
FIG. 4 is a sectional view of a flat plastic-sealed IC device according to the present invention, as mounted on and soldered to a printed circuit board.

Then, the printed circuit board 12 mounted with the plastic-sealed IC device 10 is dipped in molten solder for approximately five seconds to connect the pins to the conductors 16 with the solder. Since the plastic-sealed IC device is heated up to approximately 260° C. in the soldering process, the moisture evaporated in the vicinity of the IC chip 24 causes the thin epoxy resin wall 32 to open as a result of the internal pressure, thereby defining the bottom of the opening 28 as shown in FIG. 4, so that the evaporated moisture is allowed to escape into the atmosphere. This crack thus formed is minute as it cannot be detected visually. The stress exerted within the plastic package by the thermal expansion of the steam is absorbed only by the destruction of the thin epoxy wall 32 forming the bottom of the opening 28, and hence does not strain the entire plastic package.

Figure 5:
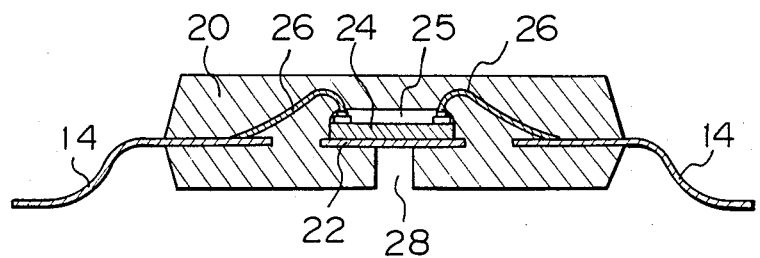
FIG. 5 is a sectional view of a flat plastic-sealed IC device, in a second embodiment, according to the present invention.

In a second embodiment of the present invention, an opening 28 is formed so that the backside of the IC chip mounting area of the lead frame is exposed to the atmosphere as shown in FIG. 5. In this embodiment, the expanded steam escapes through the gap between the lead frame and the epoxy resin area.

The plastic-sealed IC device of the present invention was subjected to a pressure cooker test to examine the resistance to thermal shock.

Figure 6:
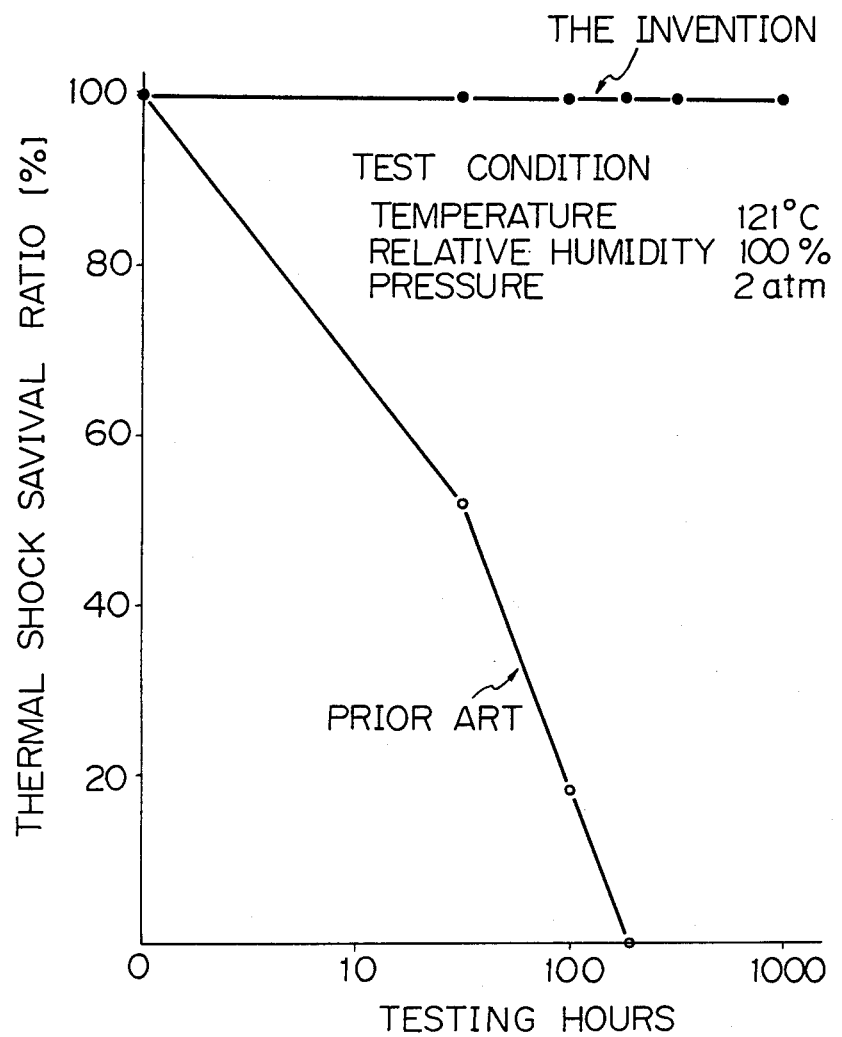
FIG. 6 is a graph showing the thermal shock survival characteristic of the conventional plastic-packaging construction and the plastic-packaging construction according to the present invention.
Figure 7:
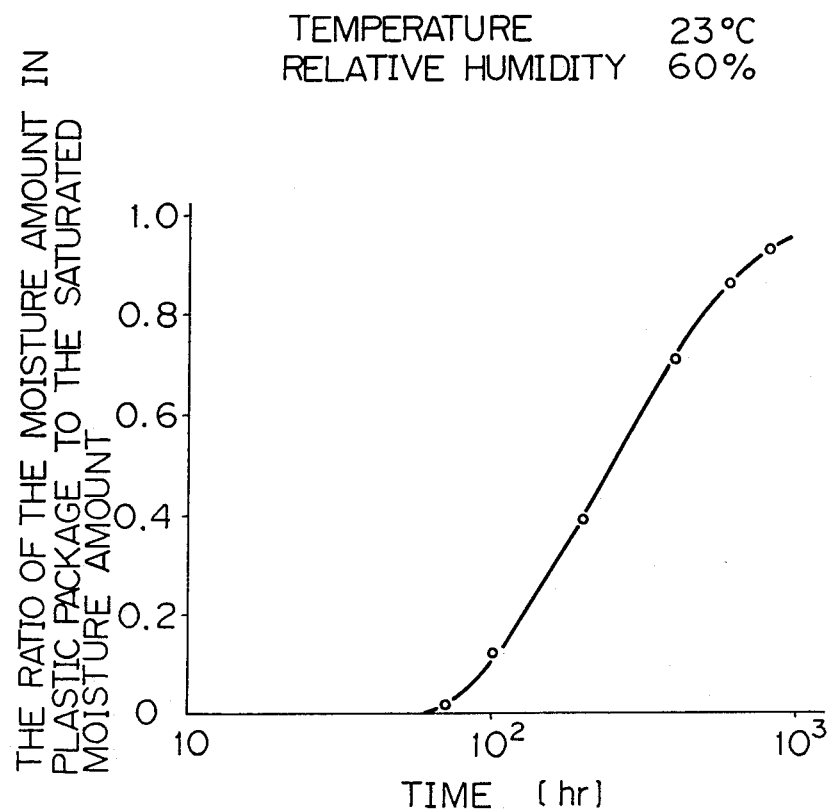
FIG. 7 is a graph showing the moisture permeability of the plastic package

FIG. 6 shows the results of the test of plastic-sealed IC devices each with an opening and without an opening in thermal shock survival ratio. The test conditions were 2 atms in pressure 121° C. in temperature and 100% in relative humidity. As apparent from FIG. 6, all the plastic-sealed IC devices each without an opening fissured within approximately 100 hours of test duration, whereas none of the plastic-sealed IC devices each with an opening fissured after approximately 1000 hours of test duration.

The construction of the plastic package according to the present invention restricts the separation of the plastic package from the lead frame within a limited extent, therefore, the moisture resistance of the plastic-sealed IC device, under the normal conditions of use, is improved.

As apparent from that has been described hereinbefore, the construction of the plastic package according to the present invention has excellent resistance to thermal shock and hence is suitable for a plastic-sealed IC device to be mounted on a printed circuit board by dip soldering in the mass production process.

Although the invention has been described as applied to a flat plastic-sealed IC device, it is obvious that the present intention is applicable also to a DIP IC device.

What is claimed is:

1. A flat plastic-sealed semiconductor IC device comprising an IC lead frame having a chip mounting area and a plurality of pins; an IC chip with a pad area fixedly mounted on the front surface of said mounting area of the IC lead frame; wires each which connects the pad area of said IC chip with said pins; and a flat plastic package sealing said IC lead frame; said plastic package having an opening formed in the back surface of said plastic package which penetrates through the surface of the plastic package and exposes a limited portion of the back surface of the chip mounting area to the atmosphere, said opening being of such size that it essentially cannot be detected visually but sufficient to release the moisture in the vicinity of said IC chip to the atmosphere through said opening when said IC device is subjected to heat treatment.

2. A plastic-sealed IC device according to claim 1, wherein said package is an epoxy resin and the diameter of said opening is 1 to 2 mm.

* * * * *